(12) United States Patent
Tihanyi

(10) Patent No.: US 6,777,726 B2
(45) Date of Patent: Aug. 17, 2004

(54) MOSFET SOURCE, DRAIN AND GATE REGIONS IN A TRENCH BETWEEN A SEMICONDUCTOR PILLAR AND FILLING INSULATION

(75) Inventor: Jenoe Tihanyi, Kirchheim (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/213,414

(22) Filed: Aug. 5, 2002

(65) Prior Publication Data

US 2003/0030102 A1 Feb. 13, 2003

Related U.S. Application Data

(63) Continuation of application No. PCT/DE01/00441, filed on Feb. 2, 2001.

(30) Foreign Application Priority Data

Feb. 4, 2000 (DE) .......................................... 100 04 872

(51) Int. Cl.[7] .............................................. H10L 27/148
(52) U.S. Cl. ...................................... 257/244; 257/243
(58) Field of Search ............................ 257/20, 27, 213, 257/243, 244, 330, 531, 520, 521

(56) References Cited

U.S. PATENT DOCUMENTS

| 4,910,564 A | | 3/1990 | Inoue |
| 4,933,734 A | | 6/1990 | Inoue |
| 5,793,082 A | * | 8/1998 | Bryant ........................ 257/330 |
| 6,635,534 B2 | * | 10/2003 | Madson ...................... 438/270 |

FOREIGN PATENT DOCUMENTS

| EP | 0 472 726 A1 | 3/1992 |
| EP | 0 510 667 A1 | 10/1992 |
| JP | 09 283 766 | 10/1997 |

OTHER PUBLICATIONS

Stephen C. Kuehne et al.: "SOI MOSFET with Buried Body Strap by Wafer Bonding", *IEEE Transactions on Electron Devices*, vol. 45, No. 5, May 1998, pp. 1084–1090.

* cited by examiner

*Primary Examiner*—Fetsum Abraham
(74) *Attorney, Agent, or Firm*—Laurence A. Greenberg; Werner H. Stemer; Ralph E. Locher

(57) ABSTRACT

In a metal oxide semiconductor (MOS) field effect transistor configuration, a source, a drain and a gate are embedded between a semiconductor pillar that extends away from a semiconductor body and forms a body region. A filling insulator surrounds the semiconductor pillar and is situated on the semiconductor body for insulating the MOSFET.

10 Claims, 1 Drawing Sheet

MOSFET SOURCE, DRAIN AND GATE REGIONS IN A TRENCH BETWEEN A SEMICONDUCTOR PILLAR AND FILLING INSULATION

CROSS-REFERENCE TO RELATED APPLICATION

This application is a continuation of copending International Application No. PCT/DE01/00441, filed Feb. 2, 2001, which designated the United States and was not published in English.

BACKGROUND OF THE INVENTION

Field of the Invention

The present invention relates to a metal oxide semiconductor (MOS) field effect transistor configuration in which the body region of a MOS transistor is connected to a semiconductor body and via the latter is at a fixed potential.

Attempts have been made for a long time to implement MOS field effect transistor configurations that have a small area, low capacitances and, are able to carry high currents. MOS field effect transistor configurations which meet these requirements to a large extent are implemented in silicon-on-insulator (SOI) technology, as is known (in this regard, see for example the reference by Stephen C. Kühne at al., titled "SOI MOSFET with Buried Body Strap by Wafer Bonding" in IEEE Transactions on Electron Devices, volume 45, no. 5, May 1998, pages 1084 to 1090). In such MOS field effect transistor configurations using SOI technology, however, the body region is to be at a fixed potential, in order that no "kink effects", that is to say bends and discontinuities in the current/voltage characteristic, occur. However, in MOS field effect transistor configurations in SOI technology it has not hitherto been possible to keep the body region at a fixed potential, since the region adjoins the insulator, so that hitherto it has not appeared to be possible without great effort to supply the body region with a fixed potential.

SUMMARY OF THE INVENTION

It is accordingly an object of the invention to provide a MOS field effect transistor configuration that overcomes the above-mentioned disadvantages of the prior art devices and methods of this general type, which uses a technology similar to SOI technology but in which the body region can readily be kept at a fixed potential.

With the foregoing and other objects in view there is provided, in accordance with the invention, a metal oxide semiconductor (MOS) field effect transistor configuration. The configuration contains a semiconductor body and a semiconductor pillar pointing away from the semiconductor body and forming a body region. The body region is connected to the semiconductor body and due to the semiconductor body, the body region is at a fixed potential. A filling insulator surrounds the semiconductor pillar and is disposed on the semiconductor body. A source, a drain and a gate are embedded between the semiconductor pillar and the filling insulator.

In a MOS field effect transistor configuration of the type mentioned at the beginning, according to the invention, the object is achieved by the source, drain and gate of the MOS transistor being embedded between a semiconductor pillar which points away from the semiconductor body and forms the body region and a filling insulator which surrounds the semiconductor pillar and is situated on the semiconductor body.

The MOS field effect transistor configuration according to the invention has a "side-wall transistor structure": a semiconductor pillar made, for example, of p-conductive silicon is situated on the surface of a semiconductor body, which can likewise consist of p-conducting silicon, and is embedded there on the surface in a filling insulator, such as silicon dioxide or another suitable insulator (silicon nitride or silicon dioxide and silicon nitride and so on).

Of course, another suitable semiconductor material can be selected instead of silicon, such as an $A_{III}B_V$ composite semiconductor or SiC and so on. It is likewise possible to provide a semiconductor body and a semiconductor pillar of the n-conductivity type instead of the p-conduction type.

Parallel to the semiconductor pillar, into the boundary region between the semiconductor pillar and the filling isolator surrounding the latter, trenches for the source and drain are driven in and, in the case of a p-conducting semiconductor pillar, are filled with n+-conducting polycrystalline silicon, so that n-conducting zones for source and drain are produced in the semiconductor pillar itself as a result of diffusion.

Situated between the trenches for the source and drain is a gate trench, whose walls and bottom are covered with an insulating layer of silicon dioxide and/or silicon nitride, for example, and which is otherwise filled, like the source and drain trenches, with n+-conducting polycrystalline silicon. Here, the gate trench can be provided in such a way that it touches or else intersects the trenches for source and/or drain.

In such a configuration, the channel of the field effect transistor is formed by the sidewall of the semiconductor pillar. A depth of the gate, source and drain trenches determines the channel width, while the channel length is determined by the distance between the source and drain on the sidewall of the semiconductor pillar along the gate trench.

With the MOS field effect transistor configuration according to the invention, it is possible to implement large relationships between a channel width W and a channel length L on a very small area, that is to say to achieve large values for W/L and to have small capacitances for the conductors.

It is of great importance that, in the MOS field effect transistor configuration according to the invention, the body region that is formed by the semiconductor pillar can readily be at a fixed potential via the semiconductor body that is connected to the body region.

The invention advantageously permits the production of n-channel and p-channel field effect transistors. The semiconductor pillar can therefore have the n-conductivity type and the p-conductivity type in the same way. The n-channel and p-channel field effect transistors can readily be supplied with a suitable body voltage via the associated p-conducting and n-conducting semiconductor bodies.

In a development of the invention, it is possible to implement semiconductor pillars of various conductivity types for at least one n-channel MOS field effect transistor on a semiconductor body and to implement a p-channel MOS field effect transistor in a CMOS configuration. For this purpose, it is merely necessary for the "substrate zone" forming the semiconductor body for the n-channel MOS field effect transistor to be p-doped—as explained at the beginning—while n-doping is provided for the substrate zone of a p-channel MOS field effect transistor.

The source, drain and gate electrodes of polycrystalline silicon in the MOS field effect transistor configuration according to the invention can readily be wired in a threelayer connection system if suitable contact holes are provided between the individual levels of the polycrystalline silicon. These levels can readily be wired in a multi-layer metallization.

Suitable filling insulators are materials with a low dielectric constant or a combination of such materials, such as silicon dioxide, undoped polycrystalline silicon and so on.

In a process for the production of the MOS field effect transistor configuration according to the invention, first a p– (or n–) conducting semiconductor pillar is etched on a surface of a semiconductor body. The semiconductor body has the same conductivity type as the semiconductor pillar. A filling insulator of silicon dioxide, for example, is then applied around the pillar. In the boundary region between the filling insulator and the initial semiconductor pillar, a trench for the source is then introduced by isotropic etching. The trench is provided with a filling of n+-conducting polycrystalline silicon. Following structuring and intermediate insulation, the trench for the drain is etched and provided with a filling of n+-conducting polycrystalline silicon. There then follows the etching for the drain level. Following a further intermediate insulation, the trench for gate is etched and the gate insulating layer is produced. Then, a filling of n+-conducting polycrystalline silicon for the gate level is introduced into the trench and is subsequently structured. There finally follows a multilayer metallization for the source, drain and gate.

With the invention, it is possible to produce MOS field effect transistors with an L/W ratio of about $0.1 \,\mu m/5 \,\mu m$, the area requirement corresponding to a conventional lateral field effect transistor with a corresponding L/W ratio of 0.1/1.

MOS field effect transistors according to the present invention are suitable in particular for logic ICs and for low-voltage CMOS ICs with a high operating speed, such as are used in particular in telecommunications or in portable computers.

It should also be noted that the cross section of the initial semiconductor pillar before the etching of the trenches for the source, drain and gate does not necessarily need to be rectangular but can also assume other shapes. Specifically, for example, it can be an oval, T-shaped or else trapezoidal.

With the foregoing and other objects in view there is provided, in accordance with the invention, a process for producing a metal oxide semiconductor (MOS) field effect transistor configuration. The method includes providing a semiconductor body, etching an initial semiconductor pillar in the semiconductor body, surrounding the initial semiconductor pillar with a filling insulator, and forming trenches for a source, a drain and a gate in a boundary region between the initial semiconductor pillar and the filling insulator, so that, of the initial semiconductor pillar, only a semiconductor pillar forming a body region remains. A dopant of a first conductivity type opposite to a dopant of a second conductivity type of the semiconductor pillar is introduced from the trenches for the source and the drain into regions of the semiconductor pillar which adjoin the trenches. A trench of the trenches is filled with an insulating layer, and a conductive material is disposed on the insulating layer for forming the gate.

Other features which are considered as characteristic for the invention are set forth in the appended claims.

Although the invention is illustrated and described herein as embodied in a MOS field effect transistor configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
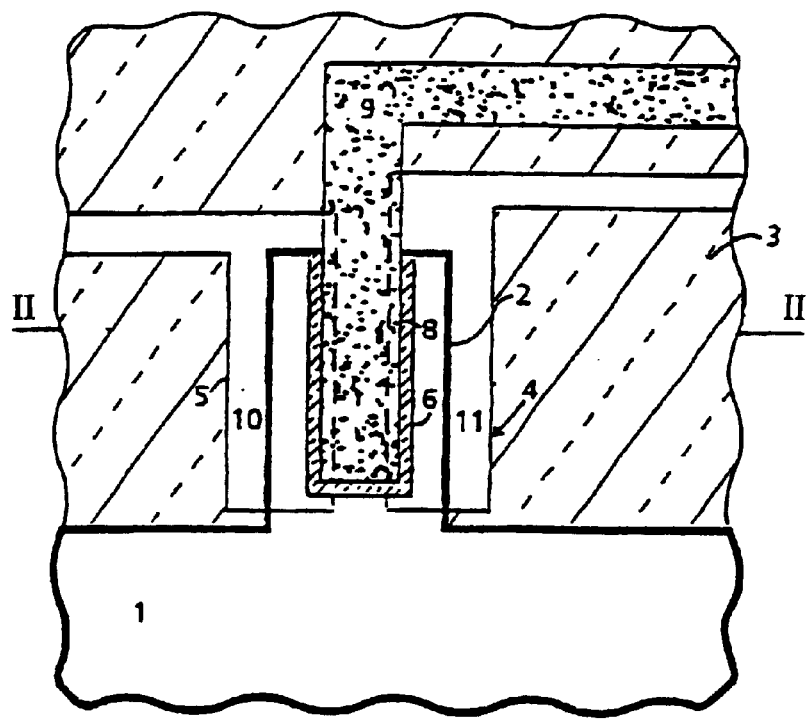
FIG. 1 is a diagrammatic, partial sectional view of a MOS field effect transistor configuration according to the invention and taken along the line II—II shown in FIG. 1.

Referring now to the figures of the drawing in detail and first, particularly, to FIG. 1 thereof, there is shown a p-conducting silicon body 1, on which by etching, a p-conducting initial silicon column 2 is formed. The initial silicon column 2 is surrounded by a filling insulator 3 of silicon dioxide, for example. Instead of silicon, an $A_{III}B_V$ semiconductor or silicon carbide (SiC) and so on can also be used.

Figure 2:
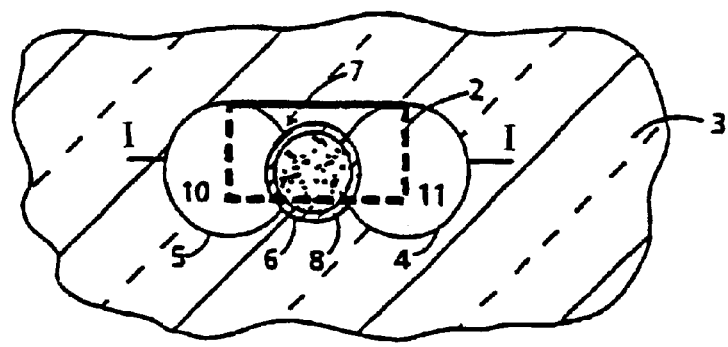
FIG. 2 is a sectional view taken along the line II—II shown in FIG. 1.

Trenches 4, 5 and 6 for a drain, a source and a gate are introduced into a boundary region between the initial silicon pillar 2 and the filling insulator 3, so that, of the initial silicon pillar 2, only a residual silicon pillar 7 remains (see FIG. 2).

The trenches 4, 5 are filled with n+-conducting polycrystalline silicon, from which an n-dopant diffuses into the remaining silicon pillar 7, in order there to form a drain zone in a region of the trench 4 and a source zone in the region of the trench 5. However, the source zone and the drain zone can also be implanted.

The trench 6 is lined with an insulating layer 8 of silicon dioxide or silicon nitride, for example, and then filled with n+-conducting polycrystalline silicon to form a gate electrode 9. Instead of silicon dioxide, silicon nitride can also be used, if appropriate, so that there is an "MNS" structure.

There is therefore a sidewall transistor structure containing a source electrode 10 of the n+-conducting polycrystalline silicon in the trench 5, a drain electrode 11 of the n+-conducting polycrystalline silicon in the trench 4, the gate electrode 9 and the gate insulator 8. The n-channel is led along the sidewall of the gate insulator 10 in the remaining silicon pillar 7.

Since the remaining silicon pillar 7, like the initial silicon pillar 2, coheres directly with the silicon body 1, they are at the same potential as the silicon body 1. In other words, the body region of the MOS field effect transistor configuration has the same potential as the silicon body 1, that is to say a fixed potential, if the silicon body 1 is at the fixed potential, which is readily possible. In this way, with the MOS field effect transistor configuration according to the invention, which provides comparable advantages to SOI technology, "kink effects" can reliably be avoided.

As can be seen from FIGS. 1 and 2, in the MOS field effect transistor configuration according to the invention, a W/L ratio is determined by a depth of the trenches 4, 5, 6 with respect to a channel width W and by a distance between the trench 5 and the trench 4 along the side wall of the trench 6 in relation to a channel length L. It is therefore possible to implement large W/L relationships on a very small area since, with a small diameter of the trenches, the latter can reach a considerable depth.

The production of the MOS field effect transistor configuration according to the invention is relatively simple since, following the structuring of the silicon body 1 to form the silicon pillar 2, and following the fitting of the filling insulator 3, only conventional etching techniques are used to form the trenches 4, 5 and 6 and fill them with polycrystalline silicon. In addition, the metallization of the MOS field effect transistor configuration according to the invention can be performed by the conventional measures.

Figure 3:
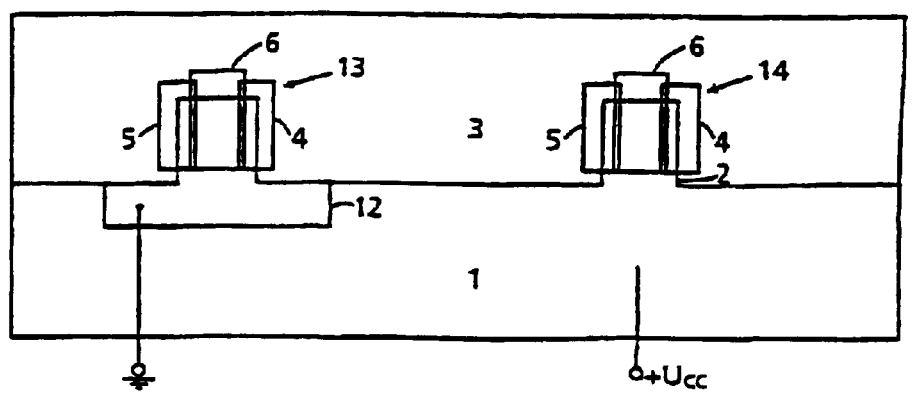
FIG. 3 is a schematic illustration of the MOS field effect transistor configuration according to the invention for CMOS ICs.

Materials with a low dielectric constant are preferably used for the filling insulator, such as in particular silicon dioxide or undoped polycrystalline silicon. FIG. 3 shows a CMOS structure for the MOS field effect transistor configuration according to the invention in schematic form. Here, in the n-conducting silicon body 1, there is additionally a p-conductive region 12, which also forms a silicon pillar, which is accordingly p-doped. The p-doped region can be connected to zero potential, for example, while there is a positive potential +Ucc of 3 V on the silicon body 1.

In this way, an n-channel MOS field effect transistor 13 can be implemented beside a p-channel MOS field effect transistor 14 in a CMOS configuration.

I claim:

1. A metal oxide semiconductor (MOS) field effect transistor configuration, comprising:
   a semiconductor body;
   a semiconductor pillar pointing away from said semiconductor body and forming a body region, said body region connected to said semiconductor body and due to said semiconductor body, said body region being at a fixed potential;
   a filling insulator surrounding said semiconductor pillar and disposed on said semiconductor body;
   a sources a drain and a gate embedded between said semiconductor pillar and said filling insulator;
   a boundary region between said semiconductor pillar and said filling insulator having trenches formed therein for forming said source and said drain; and
   a conductive material filling said trenches wherein a source zone and a drain zone are formed by one of diffusion and implantation from said trenches.

2. The MOS field effect transistor configuration according to claim 1:
   wherein said boundary region has an additional trench formed therein between said trenches for said source and said drain;
   further comprising a gate insulator insulating said additional trench; and
   further comprising a further conductive material filling said additional trench for forming said gate.

3. The MOS transistor configuration according to claim 1, wherein said semiconductor pillar is one of a plurality of pillars having various conductivity types disposed on said semiconductor body for at least one n-channel MOS field effect transistor and a p-channel MOS field effect transistor in a CMOS configuration.

4. The MOS field effect translator configuration according to claim 3, wherein said trenches and said additional trench have given depths, and a channel width is determined by said given depths of said trenches and said additional trench.

5. The MOS field effect transistor configuration according to claim 1, wherein said filling insulator is formed of a material with a low dielectric constant.

6. The MOS field effect transistor configuration according to claim 2, wherein said gate insulator is formed of at least one material selected from the group consisting of silicon dioxide and silicon nitride.

7. The MOS field effect transistor configuration according to claim 1, wherein said filling insulator is formed of at least one material selected from the group consisting of silicon dioxide, non-doped polycrystalline silicon, and a substance with a low dielectric constant.

8. The MOS field effect transistor configuration according to claim 1, wherein said semiconductor body and said semiconductor pillar have an equivalent conductivity type and are both one of n-doped and p-doped.

9. The MOS field effect transistor configuration according to claim 1, wherein said semiconductor body and said semiconductor pillar are formed of a material selected from the group consisting of silicon, an $A_{III}B_V$ semiconductor and SiC.

10. The MOS field effect transistor configuration according to claim 2, wherein said additional trench for said gate at least touches said trenches for said source and said drain.

* * * * *